(12) United States Patent
Sakurai et al.

(10) Patent No.: US 7,544,952 B2
(45) Date of Patent: Jun. 9, 2009

(54) MULTIVALENT ION GENERATING SOURCE AND CHARGED PARTICLE BEAM APPARATUS USING SUCH ION GENERATING SOURCE

(75) Inventors: Makoto Sakurai, Kobe (JP); Fumiharu Nakajima, Kobe (JP); Takunori Fukumoto, Kobe (JP); Nobuyuki Nakamura, Chofu (JP); Shunsuke Ohtani, Naka-gun (JP); Shinro Mashiko, Kobe (JP)

(73) Assignee: Japan Science and Technology Agency (JP)

( * ) Notice: Subject to any disclaimer, the term of this patent is extended or adjusted under 35 U.S.C. 154(b) by 170 days.

(21) Appl. No.: 11/576,945

(22) PCT Filed: Apr. 8, 2005

(86) PCT No.: PCT/JP2005/007284

§ 371 (c)(1),
(2), (4) Date: Apr. 9, 2007

(87) PCT Pub. No.: WO2006/040850

PCT Pub. Date: Apr. 20, 2006

(65) Prior Publication Data

US 2008/0087842 A1    Apr. 17, 2008

(30) Foreign Application Priority Data

Oct. 8, 2004    (JP) .............................. 2004-296890

(51) Int. Cl.
*H01J 27/20*    (2006.01)
(52) U.S. Cl. .................. 250/427; 250/423 R; 250/424; 313/153; 313/160; 315/85

(58) Field of Classification Search ............. 250/423 R, 250/424, 427; 313/153, 160; 315/85
See application file for complete search history.

(56) References Cited

U.S. PATENT DOCUMENTS 4,780,642 A * 10/1988 Jacquot .................... 313/359.1

(Continued)

FOREIGN PATENT DOCUMENTS

JP    59-121735 A    7/1984

(Continued)

OTHER PUBLICATIONS

Nobuyuki Nakamura (et al.), "Electron Beam Ion Trap (EBIT) no Kaihatsu to Taka Ion no Kenkyu", Nippon Butsuri Gakkaishi, 1997, vol. 52, No. 12, pp. 919 to 923.

(Continued)

*Primary Examiner*—Jack I Berman
*Assistant Examiner*—Michael Maskell
(74) *Attorney, Agent, or Firm*—Chen Yoshimura LLP (57) ABSTRACT

A multicharged ions generating source that is easy to manufacture, excellent in controllability and maintainability, high in degree of ionization and large in beam intensity and a charged particle beam apparatus using the same are disclosed. The multicharged ions generating source includes an ion source electrode (3) comprising an electron source (4), a drift tube (5) that constitutes an ion trapping region and a collector (6), a superconducting magnet (11) for ion entrapment, an ion infeed means (20, 22), a first vacuum chamber (2) receiving the ion source electrode (3), a second vacuum chamber (10) receiving the superconducting magnet (11), and a vacuum pumping unit (15, 16) provided for each of the first and second vacuum chambers. The first and the second vacuum chambers (2) and (10) are made removable from each other, and only the ion source electrode (3) to be held at extremely high vacuum can be baked for degassing.

9 Claims, 7 Drawing Sheets

U.S. PATENT DOCUMENTS 5,336,961 A * 8/1994 Jacquot et al. .............. 313/153

FOREIGN PATENT DOCUMENTS

| JP | 1-251541 | | 10/1989 |
|---|---|---|---|
| JP | 5- 275048 | A | 10/1993 |
| JP | 7-262946 | A | 10/1995 |
| JP | 8-106872 | A | 4/1996 |
| JP | 11- 233335 | A | 8/1999 |
| JP | 2003-208869 | A | 7/2003 |
| JP | 2004-87542 | A | 3/2004 |
| JP | 2004- 111330 | A | 4/2004 |
| JP | 2004-202245 | A | 7/2004 |

OTHER PUBLICATIONS

Shunsuke Otani, "Electron Beam Ion Trap o Mochiita Taka Ion no Kenkyu", Journal of Plasma and Fusion Research, 1997, vol. 73, No. 10, pp. 1063 to 1079.

Makoto Sakurai et al., "Design of EBIS for Nanoprocessing using HCI" together with a Certificate indicating that the document was published in an Internet webstie on Apr. 9, 2004.

The same document as above together with a Certificate evidencing that the document was distributed on Apr. 14, 2004 in Japan at the 9th International Symposium on Electron Beam Ion Sources and Traps and Their Applicaitons EBIS/T2004.

Makoto Sakurai et al., "Design of EBIS for nanoprocesses using HCI", Journal of Physics; Conference Series 2 (2004) pp. 52-56, together with a Certificate evidencing that the document was published in an Internet website on Apr. 27, 2004.

Makoto Sakurai et al., "Development of Electron Beam Ion Source for Nanoprocess using Highly Charged Ions," together with a Certificate evidencing that the document was published on Sep. 6, 2004.

PCT/IPEA/409 "International Preliminary Report on Patentability" for PCT/JP2005/007284. Its translation of Section I, V, VIII, and its transmittal form of IB 338.

J.W. McDonald et al., "Observation of High Electron Emission Yields following Highly Charged Ion Impact (up to Th 75+) on Surfaces" in "Physical Review Letters", Apr. 13, 1992, vol. 68, No. 15, pp. 2297-2300.

T. Meguro et al. "Creation of nanodiamonds by single impacts of highly charged ions upon graphite" in "Applied Physics Letters", Dec. 3, 2001, vol. 79, No. 23, pp. 3866-3868.

T. Schenkel et al. "Solid state quantum computer development in silicon with single ion implantation" in "Journal of Applied Physics", Dec. 1, 2003, vol. 94, No. 11, pp. 7017-7024.

N. Kobayashi et al. "Design and Construction of a Horizontally Placed Superconducting Magnet and its Cryostat for an Electron Beam Ion Source", including English abstract, Data and Technical Report IPPJ-DT-84, Mar. 1981, Institution of Plasma Physics, Nagoya University, Japan, Mentioned on p. 3 of the as-filed translation of the specification as concise explanation of relevance.

M. Levine et al. "The Electron Beam Ion Trap: A New Instrument for Atomic Physics Measurements" in "Physical Scripta", 1988, vol. T22, pp. 157-163.

"Refrigerated Electrin Beam Ion Trap/Source" (REBIT/S), Physics & Technology Inc., http://www.physicstechnology.com/pt brochure. pdf, 2 pages, searched on the internet on Oct. 5, 2004.

"The Dresden EBIT", G. Zschrnack, Technical University Dresden, Atomic Physics Group, http://www.physik.tu-dresden.de/apg/apeebitl.htm, 2 pages, searched on the internet on Oct. 5, 2004.

E. N. Beebe et al. "Extraction of highly charged Au ions from a multiampere electron beam EBIS at BNL" in "Review of Scientific Instruments", Feb. 2002, vol. 73, No. 2, pp. 699-701.

* cited by examiner

MULTIVALENT ION GENERATING SOURCE AND CHARGED PARTICLE BEAM APPARATUS USING SUCH ION GENERATING SOURCE

TECHNICAL FIELD

The present invention relates to a source of generating multicharged ions and a charged particle beam apparatus using such a multicharged ions generating source.

BACKGROUND ART

While removing an electron from an atom forms a positive ion, that which has more than two electrons removed, such as, e.g., $Xe^{44+}$ ion, is called a positive multicharged ion, which has an extremely large internal energy. It is known that bombarding multicharged ions on a solid surface causes many peculiar phenomena such as emission of a large number of secondary electrons and giving rise to a large structural change in nanometer size around a point of incidence of the multicharged ions (see References 1 and 2 in the list below). Unique interactions of such multicharged ions with a material have focused the spotlight of attention upon their feasible application to processes in a nanometer region such as single-ion implantation and fabrication of a quantum dot (see Reference 3 in the list below). As the ion source from which to produce such multicharged ions there are generally known electron cyclotron resonance (ECR) type ions generating source (ECRIS) and electron beam type ions generating source (EBIS), the latter being featured by high degree of ionization of ions obtained.

As an EBIS according to Prior Art 1 there is known an apparatus of the National Institute for Fusion Science that has been developed for researches in the atomic physics (see, e. g., Reference 4 in the list below). This apparatus comprises an electron source (cathode), a drift tube, a collector, a solenoid magnet and an ion extracting lens so configured that electrons exiting the cathode are passed through the drift tube and collected by the collector. The electrons are compressed by a strong magnetic field formed in the drift tube, becoming an electron beam of large current density. On the other hand, a gas introduced from the vicinity of the cathode is ionized within the drift tube. The drift tube is split into a plurality of electrode regions across both ends of which is applied a square well potential having a barrier to ions. The ions are trapped in a given time period within the square well potential and become multicharged ions as ionization by their collision with electrons proceeds. Of such multicharged ions, those whose kinetic energy is increased beyond the barrier by their collision with electrons are led towards the ion extracting lens so that they are taken out of the ions generating source.

Further, in 1988 EBIT (electron beam ion trap) according to Prior Art 2 was developed which was improved over the EBIS according to Prior Art 1 (see Reference 5 in the list below). The EBIT of Prior Art 2 which is identical in principle of generating multicharged ions to the EBIS uses a superconducting Helmholtz type coil and a reduced length of the drift tube such as to avoid the instability of plasma in the drift tube, thereby improving the confinement time for ions so that the high multivalent muticharged ions can stably be retained. As a consequence, in the EBIT it has been made possible to squeeze an electron beam in the drift tube to the ultimate to form highly ionized ions.

As an EBIT according to Prior Art 3 there has also been developed by the present inventors an apparatus (see Reference 6 in the list below) that has an electron accelerating voltage of 300 kV at its maximum to allow completely ionizing uranium (U). This EBIT was developed for researches in the atomic physics and has the highest performance in the world as the internal energy of multicharged ions that can be produced. There have been the problems, however, that the apparatus is expensive and costly in operation to obtain high beam intensity.

As Prior Art 4, there has also been developed a REBIT in the Lawrence Berkeley Institute of the USA where the superconducting magnet in the EBIT is cooled by a closed-cycle type refrigerator (see Reference 7 in the list below).

As the EBIT according to Prior Art 5, a commercial product using a permanent magnet was developed by Technical University Dresden jointly with Leybold Vacuum in Germany, but is weaker in beam intensity than the EBIT using the superconducting magnet since a permanent magnet is weak in magnetic field (see Reference 8 below).

As the EBIS of Prior Art 6, an apparatus of Brookhaven Laboratory in the USA (see Reference 9 in the list below) separates a superconducting magnet from an electron source, a drift tube and a collector that are required to produce ions (and which are herein referred to collectively as an ion source electrode). In separating the superconducting magnet from the ion source electrode, however, this apparatus entails breaking vacuum in the ion source electrode. As a result, the EBIS of Prior Art 6 due to weak heat resistance in a region of its superconducting magnet cannot have enough degree of vacuum obtained unless it is pumped continuously over an extremely long period of time. Further, while in the EBIS the electron source, drift tube and collector must have their central axes mutually aligned with due precision, considerable amounts of time are required in their assembling and alignment since with the superconducting magnet unassembled it is not possible for the ion source electrode alone to be aligned axially.

Reference 1: J. W. McDonald, D. Schneider, M. W. Clark and D. DeWitt, Phys. Rev. Lett., Vol. 68 (1992), p. 2297;

Reference 2: T. Meguro et al., Appl. Phys. Lett., Vol. 79 (2001), p. 3866;

Reference 3: T. Schenkel et al., Appl. Phys., Vol. 94 (2003), p. 7017;

Reference 4: Nobuo Kobayashi, Shunsuke Oya and 7 others, Plasma Laboratory at Nagoya University, Data and Technical Report IPPJ-DT-84, 1981;

Reference 5: M. A. Levin and 7 others, Physica Scr., T22, 1988, p. 157;

Reference 6: Shunsuke Oya, Makoto Sakurai, Journal of Plasma and Nuclear Fusion Society, 73 (1997), p. 1063;

Reference 7: Physics & Technology, Inc., "Refrigerator Cooled Electron Beam Trap/Ion Source" (REBITS/S), [online], (publication date unclear), [Searched on Oct. 5, 2004], Internet <URL: http:/www.physicstechnology.com/pt brochure.pdf>;

Reference 8: G. Zschrnack, "The Dresden EBIT", [online], (publication date unclear), Technical University Dresden, Atomic Physics Group (Searched on Oct. 5, 2004), Internet <URL: http:// www.physik.tu-dresden.de/apg/apeebitl.htm>; and Reference 9: N. Beebe et al., Rev. Sci., Instrum., Vol. 73 (2002), p. 699.

The multicharged ions generating sources according to Prior Arts 1 to 5 entailed considerable mount of time and cost in its manufacture, adjustment, operation and maintenance, since their ion source electrode comprising an electron source, a drift tube and a collector and their superconducting magnet are disposed in a common vacuum chamber and their beam intensity is weak.

Further, there is the case as in the multicharged ions generating source according to Prior Art 6 where the superconducting magnet is separated from the ion source electrode required to produce ions. Then, the need arose to beak vacuum in the ion source electrode. As a result, considerable amounts of time are required in their assembling and alignment since with the superconducting magnet unassembled it is not possible for the ion source electrode alone to be aligned axially.

Thus, the multicharged ions generating sources according to Prior Arts that are all designed for researches in the atomic physics are defective in their operability and maintainability and moreover are weak in beam intensity. Thus, no practical source of generating multicharged ions has yet been implemented for use in machining to form, e.g., a nano structure (microfine device in a nanometer order).

DISCLOSURE OF THE INVENTION

With these problems taken into account, the present invention has for its object to provide a source of generating multicharged ions that is easy to manufacture, excellent in operability and maintainability, high in degree of ionization and large in beam intensity and a charged particle beam apparatus using such an multicharged ions generating source.

As a result of zealous investigations conducted to solve the problems mentioned above, the present inventors have discovered that with components of an ion source electrode disposed in a common vacuum chamber and a superconducting magnet arranged in a different vacuum chamber it is possible to bring to realization a source of generating multicharged ions that is easy to manufacture, assemble and adjust, and excellent in operability and maintainability. And, upon the discovery that a beam of multicharged ions can be made high in intensity and the ions generating source can be made small in size if an accelerating voltage not more than 40 kV is selected and the ion source electrode and the superconducting magnet constituting the ions generating source are configured optimally to this end, the present invention has been completed.

In order to achieve the object mentioned above, there is provided in accordance with the present invention a source of generating multicharged ions including: an ion source electrode comprising an electron source, a drift tube that constitutes an ion trapping region and a collector; a superconducting magnet for ion entrapment; and an ion infeed means, characterized in that it further includes: a first vacuum chamber receiving the said ion source electrode; a second vacuum chamber receiving the said superconducting magnet;whereinj the first vacuum chamber is disposed by being passed through the second vacuum chamber, and a vacuum pumping means are provided to the first and the second vacuum chambers, respectively, a first magnetic shield is provided in a peripheral area of the second vacuum chamber on the first vacuum chamber side so that the magnetic field by said superconducting magnet does not leak to the electron source of said ion source electrode and said drift tube of the collector side, at least the opposing surfaces of said first and second vacuum are formed with a nonmagnetic material so that the magnetic field by said superconducting magnet is applied to said drift tube, and the electron source of the ion source electrode in said first vacuum chamber is received in a second magnetic shield part.

In structure mentioned above, it is preferable that the second vacuum chamber to be cross-sectionally in the form of a ring through which the fist vacuum chamber is past.The second vacuum chamber is preferably adapted to be removable from the firs vacuum chamber without breaking vacuum of both the chambers.The superconducting magnet is preferably a superconducting magnet that uses a Helmholtz coi. it is preferable if the electron source has an accelerating volage of 10 to 40 kV.

According to the structure mentioned above, in the state that the second vacuum chamber receiving the superconducting magnet is disconnected from the first vacuum chamber, it is possible to fully heat and degas the ion source electrode received in the first vacuum chamber. This allows the first vacuum chamber for producing multicharged ions to be made extremely high vacuum in a short period of time. Thus, according to the structure of the present invention in which vacuum can be established in a short time period, it is possible to realize a source of generating multicharged ions that is excellent in operability and maintainability.

In accordance with the present invention, there is also provided a charged particle beam apparatus characterized in that it uses a source of generating multicharged ions as mentioned above to irradiate a surface of a specimen with multicharged ions.

There is further provided in accordance with the present invention a charged particle beam apparatus in another structure, characterized in that it comprises a source of generating multicharged ions that includes an ion source electrode comprising an electron source, a drift tube that constitutes an ion trapping region and a collector, a superconducting magnet for ion entrapment; and an ion infeed means, and further includes a first vacuum chamber receiving the ion source electrode, and a second vacuum chamber receiving the superconducting magnet, wherein the first vacuum chamber is disposed by being passed through the second vacuum chamber, and a vacuum pumping means are provided to the first and the second vacuum chambers, respectively, a first magnetic shield is provided in a peripheral area of the second vacuum chamber on the first vacuum chamber side so that the magnetic field by said superconducting magnet does not leak to the electron source of said ion source electrode and said drift tube of the collector side, at least the opposing surfaces of said first and second vacuum chambers are formed with a nonmagnetic material so that the magnetic field by said superconducting magnet is applied to said drift tube, the electron source of the ion source electrode in said first vacuum chamber is received in a second magnetic shield part, and further a third vacuum chamber connected to said multicharged ion generating source and its vacuum pumping means, and, by disposing an ion separator and a specimen stage in said third vacuum chamber and setting a specimen on the specimen stage, it attains the function to select the desired multicharged ion by the ion separator from the multicharged ions generated from the multicharged ion generating source, and to irradiate the specimen surface.

In the structure as mentioned above, the charged particle beam apparatus preferably further includes a means for inspecting the specimen and/or a means for treating the surface of the specimen.

According to the structure mentioned above, the specimen is irradiated with desired multicharged ions selected at the ion separator from various multicharged ions generated by the multicharged ions generating source. The means for treating the surface of the specimen allows cleaning a specimen surface prior to irradiation with multicharged ions. Also, the inspecting means permits an in site inspection of a specimen for irradiation with multicharged ions as regards its shape and/or crystallographic state. The charged particle beam apparatus using the source of generating multicharged ions according to the present invention can be applied to nano processes since the source of generating multicharged ions is small in size and light in weight.

BEST MODES FOR CARRYING OUT THE INVENTION

The present invention will better be understood from the following detailed description and the drawings attached hereto showing certain illustrative forms of implementation of the present invention. In this connection, it should be noted that such forms of implementation illustrated in the accompanying drawings hereof are intended in no way to limit the present invention but to facilitate an explanation and understanding thereof.

Figure 1:
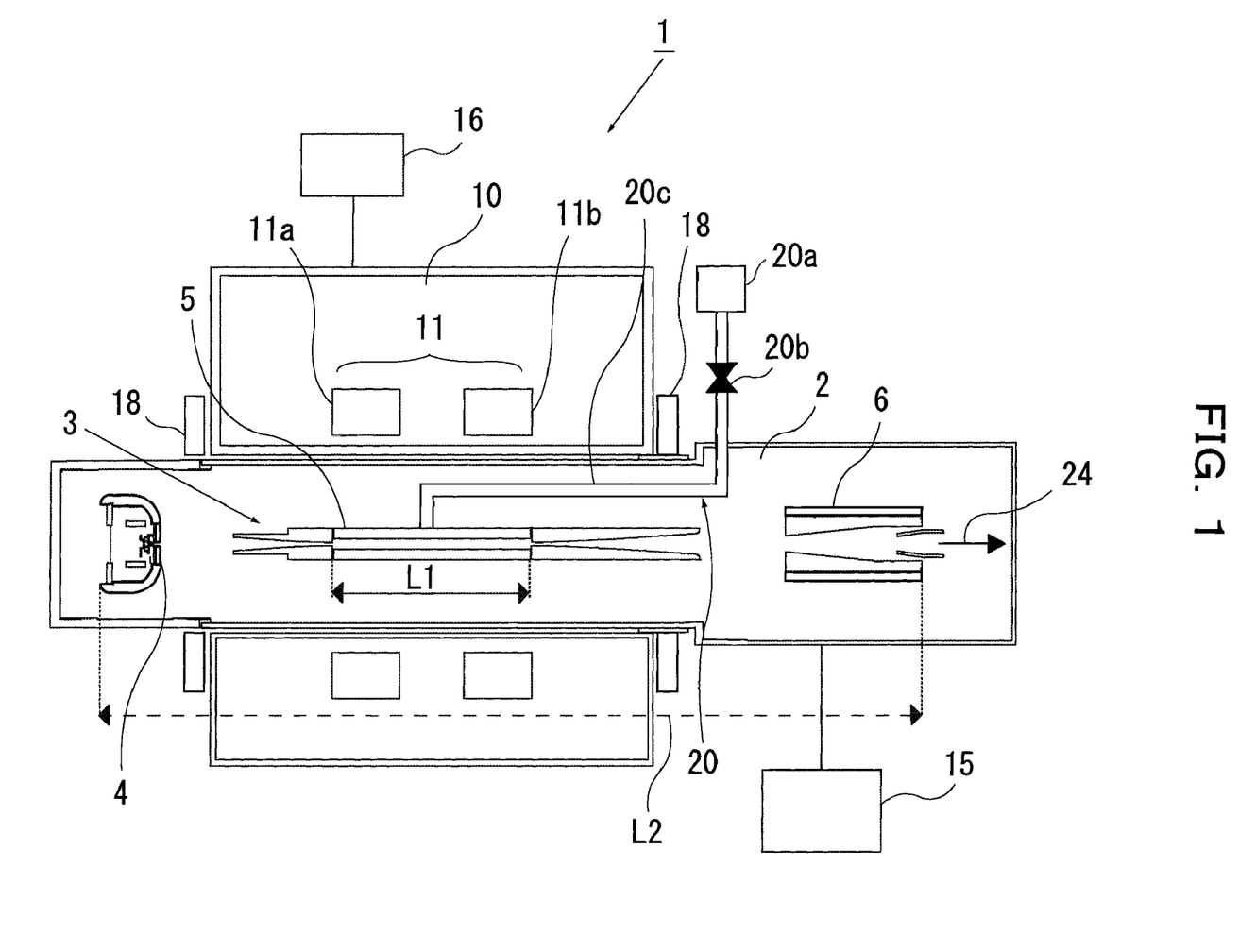
FIG. 1 is a cross sectional view diagrammatically illustrating the structure of a source of generating multicharged ions according to the present invention.

FIG. 1 is a cross sectional view diagrammatically illustrating the structure of a source of generating multicharged ions according to the present invention. In FIG. 1, a multicharged ions generating source 1 according to the present invention is shown to comprise an ion source electrode 3 disposed in a first vacuum chamber 2, a superconducting magnet 11 for ion entrapment disposed in a second vacuum chamber 10, and a gas ion infeed means 20. The ion source electrode 3 is made up of an electron source 4, a drift tube 5 that constitutes an ion trapping region, and a collector 6.

While the first and the second vacuum chambers 2 and 10 are independently formed, the first vacuum chamber 1 is arranged as passed though the inside of the second vacuum chamber 10. To wit, in the form of implementation illustrated, the second vacuum chamber 10 is cross-sectionally in the form of a ring and formed with a cylinder open to its both ends, so that through this cylindrical ring of the second vacuum chamber 10 the first vacuum unit 2 is disposed to pass. The superconducting magnet 11 is disposed with the form of a ring in the cylindrical second vacuum chamber 10.

The first and the second vacuum chambers 2 and 10 are adapted to be evacuated, independently of each other, by vacuum pumping units 15 and 16, respectively. The interior of the first vacuum chamber 2 is made at an extremely high vacuum of $1 \times 10^{-5}$ Pa (Pascal) or less, especially of $1 \times 10^{-9}$ Pa or less for generating multicharged ions. For example, a vacuum of $10^{-10}$ Pa ($10^{-12}$ Torr) is required for generating $U^{92+}$. Accordingly, the first vacuum chamber 2 is provided with a baking means using such as a baking heater (not shown) for degassing. The use of such a baking means allows the first vacuum chamber 2 to be baked to an extent of 250° C. to 300° C.

Here, the first and the second vacuum chambers 2 and 10 are composed at least along their opposing surfaces of a nonmagnetic material so that a magnetic field from the superconducting magnet 11 can be applied to the drift tube 5. The nonmagnetic material used may be austenitic stainless steel (e. g., SUS-304 or SUS-316) or aluminum.

The superconducting magnet 11 is received in the second vacuum chamber 2 so that it is thermally isolated from the exterior. The superconducting magnet 11 is cooled at a very low temperature, e.g., of 10 K (−263° C.). Also, the second vacuum chamber 10 is held at a high degree of vacuum around $10^{-4}$ Pa. To obtain such a high vacuum, the baking means is unnecessary. The second vacuum chamber 10 is provided on a peripheral area of the first vacuum chamber 2 with a magnetic shield 18, which is disposed so that the magnetic field from the superconducting magnet 11 may not come through the electron source 4 or a portion of the drift tube 4 on the side of the collector 6 of the ion source electrode 3. The magnetic shield 18 used may be made of a ferromagnetic material such as soft iron.

Figure 2:
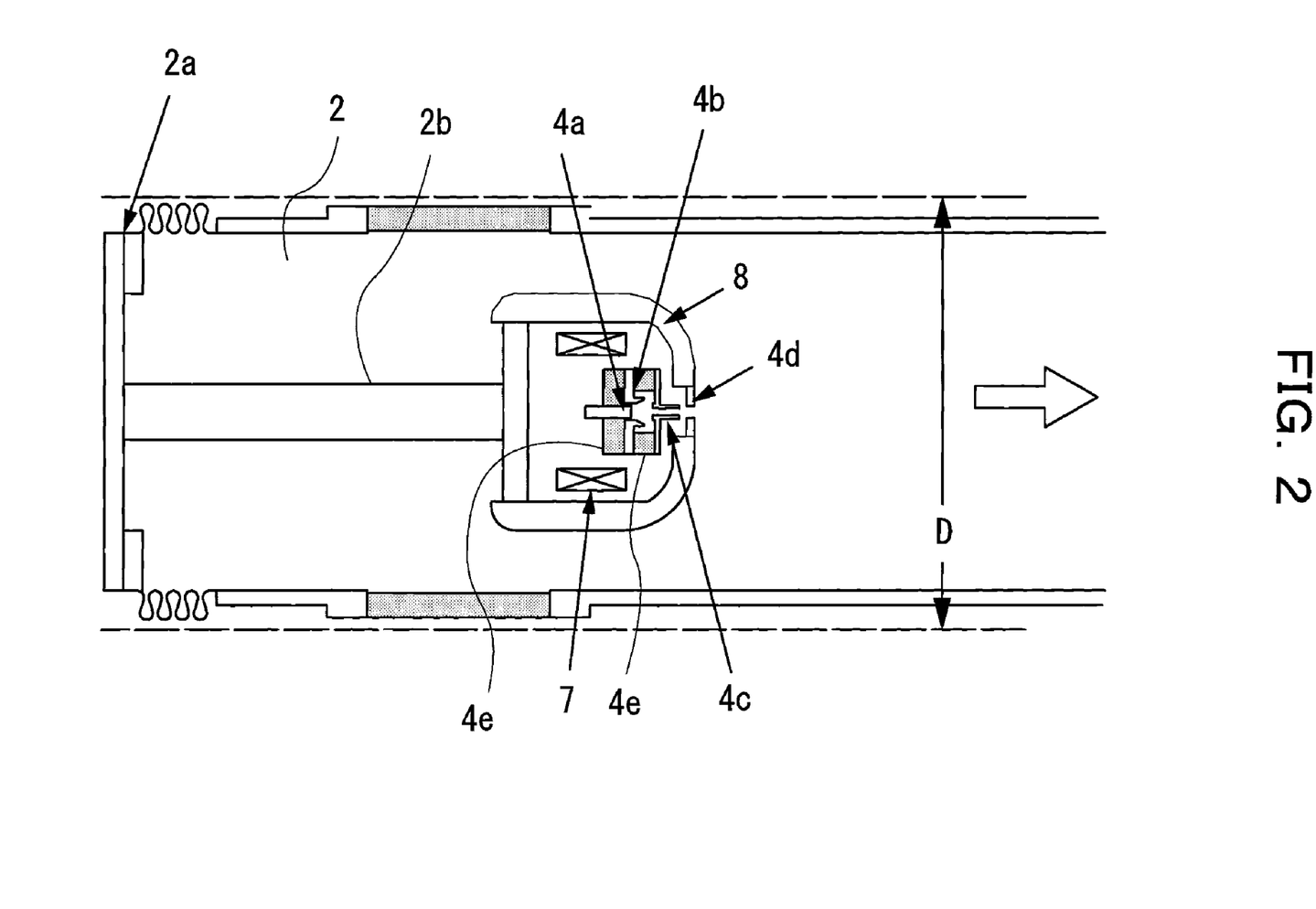
FIG. 2 is an enlarged cross sectional view diagrammatically illustrating the structure of an electron source as shown in FIG. 1.

FIG. 2 is an enlarged cross sectional view diagrammatically illustrating the structure of the electron source 4 shown in FIG. 1. As shown, the electron source 4 is supported on a support arm 2b by an ultrahigh vacuum flange 2a at a left side face of the first vacuum chamber 2 so that it lies on a horizontal, central axis of the first vacuum chamber 2. The superconducting magnet 11 received in the second vacuum chamber 10 has a bore whose diameter is indicated by D. The arrows in the Figure indicate a course of evacuation. The electron source 4 has a filament (cathode) electrode 4a, a focus electrode 4b, an anode electrode 4c and a snout electrode 4d arranged from the left to the right hand side as shown, each of which is insulated by an electrical porcelain 4e, 4e. The electron source 4 is provided with a bucking coil 7 to make the magnetic field in the vicinity of the cathode zero and it is received in a region of the magnetic shield 8.

Here, an electron beam produced from the electron source 4 needs to be guided towards the collector 6 without striking on the drift tube 5. To this end, the cathode, anode and snout electrodes 4a, 4c and 4d are fitted with the electrical porcelains 4e and 4e and assembled together so that their axes are made coincident with one another with high precision. As an example, in drawing a current of 300 mA from the cathode electrode 4a, the anode electrode 4c and the snout electrode 4d are given +10 kV and +15 kV, respectively, based on a filament potential. While a high voltage of +15 kV at maximum is applied to the bucking coil 7 and the magnetic shield region 8 as well as to each electrode, making each of the parts small while ensuring their mutual insulation allows limiting the magnetic shield region 8 to a diameter of 100 mm. It is then possible to accommodate the electron source 4 in the ultrahigh vacuum flange 2a having an outer diameter of 162 mm and an inner diameter of 102 mm and to limit the second vacuum chamber 10 at the side of the electron source 4 to a diameter of 152 mm.

Since the inner diameter of the ultrahigh vacuum flange 2a is much larger than the diameters of the magnetic shield 8 and the drift tube 5, the gas emitted from a region of the electron source 4 can be evacuated efficiently. Thus, making the electron source 4 smaller in size allows making smaller the annular bore of the second vacuum chamber 10 accommodating the superconducting magnet 11, namely the bore diameter of the superconducting magnet 11. This makes the multicharged ions generating source smaller in apparatus size, and making the apparatus smaller in size reduces its manufacturing and operating costs.

The drift tube 5 is made up of several divided cylindrical electrodes and has an electric field configured so that its both ends create a barrier (square well potential) to ions. A gas becoming ions is introduced by a gas ion infeed means 20 from side faces of the drift tube 5 into its inside. Here, the gas ion infeed means comprises 20 a gas source 20a, a flow controller 20b and a piping 20c etc. into the first vacuum chamber 2.

Figure 3:
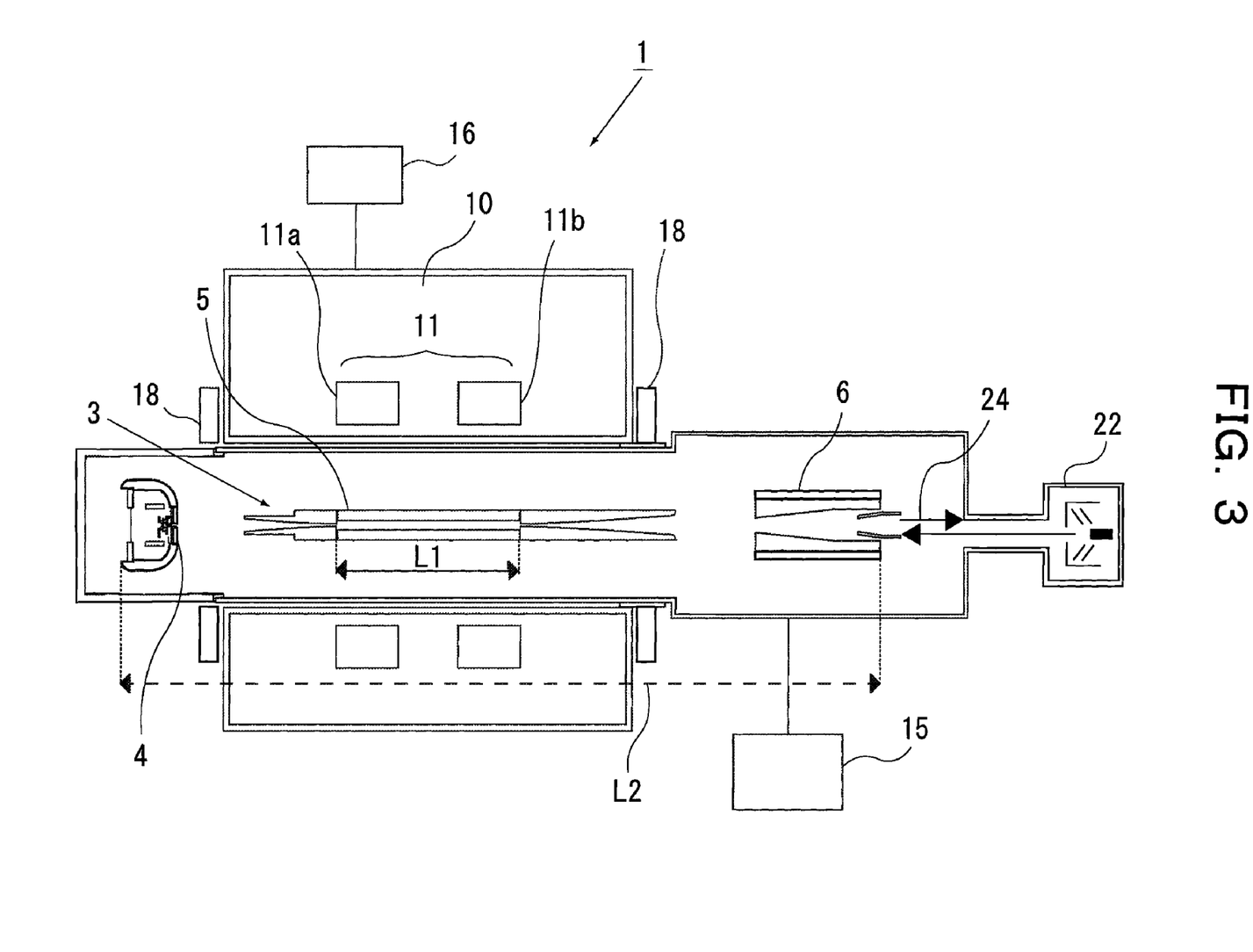
FIG. 3 is a cross sectional view diagrammatically illustrating the structure of a multicharged ions generating source having a solid ion source as its ion source.

On the other hand, if solid ions are to be generated as its source, a solid ion source may be used. FIG. 3 is a cross sectional view diagrammatically illustrating the structure of a multicharged ions generating source having a solid ion source as its ion source. The multicharged ions generating source shown in FIG. 3 differs from that shown in FIG. 1 in that in place of the gas ion infeed means 20, a solid ion infeed means 22 is provided at a right hand side of the collector 6. The solid ion infeed means 22 may use a vacuum arc type ion source which is in the form of a needle of a solid material subjected to vacuum arc discharge for ionization (monovalent) to generate desired ions. Ions produced from the solid ion infeed means 22 and entering the first vacuum chamber 2 are passed through the collector 6 and then injected into the drift tube 5.

Ions injected into the drift tube 5 from the ion infeed means constituted by either the gas ion infeed means 20 or the solid ion infeed means 22 are trapped in the square well potential for a given time period, progressed their impact ionization by electrons and they become multicharged ions. Of such multicharged ions, those which by collisions with electrons are elevated in kinetic energy so as to cross the barrier, are taken out of the multicharged ions generating source 1. When the degree of ionization for ions reaches the ultimate or a state that continuing electrons to strike no longer causes ionization to proceed, the configuration of electric field is altered so as to cause multicharged ions to issue out, thereby producing a beam of multicharged ions 24.

The collector 6 is an electrode for collecting electrons passing through the drift tube 5 and it may be made of electrodes such as a suppressor, collector or extractor electrode etc. The cathode and the collector 6 have a voltage of minus several tens kV to minus 300 kV at the maximum applied thereto relative to the earth. Such an accelerating voltage may suffice to be a voltage by which desired multicharged ions are obtained. Electrons have a maximum accelerating voltage applied thereto immediately before they are incident on the drift tube 5 and those past the drift tube 5 are decelerated to around 2 to 3 kV ahead of the collector 6 and collected by the collector 6. Accordingly, the collector has absorbed an electric power that is a product of this voltage and a consequent electron beam current. This electric power becomes 900 W when the voltage ahead of the collector 6 is 3 kV and the electron beam current is 300 mA. If electrons in a pinched state impinge on the collector 6, a collector portion impinged on will be molten. Thus, the collector 6 is designed to have an electrode structure that can be cooled by a coolant such as to collect electrons while expanding a beam thereof.

Mention is next made of the superconducting magnet. As shown in FIGS. 1 and 3, the superconducting magnet 11 makes use of a so-called Helmholtz coil that consists of a first coil portion 11a and a second coil portion 11b. If the first and the second coil portions 11a and 11b are assumed to have a radius 'a' and to be spaced apart by a distance 'a' that is the same as radius 'a', the magnetic field in the central region of the juxtaposed coil portions can be made even. Here, the superconducting magnet 11 is cooled to be a superconducting state by a cryostat or closed-cycle refrigerator using He as its coolant.

A feature of the multicharged ions generating source according to the present invention is that the superconducting magnet 11 for ion trapping is received in the second vacuum chamber 10 and the first vacuum chamber 2 is disposed to pass through an annular or ring-shaped bore of the second vacuum chamber 10. In other words, the first vacuum chamber 2 is passed through a bore of the superconducting magnet 11. As mentioned before, the ion source electrode 3 comprising the electron source 4, the drift tube 5 and the collector 6 is disposed in the fist vacuum chamber 2.

The second vacuum chamber 10 in which the superconducting magnet 11 is accommodated is made removable from the first vacuum chamber 2 without breaking vacuum of both the chambers. According to the present invention, it is sufficient if the first vacuum chamber 2 is made in which the ion source electrode 3 is accommodated therein, and the manufacture is easy since the superconducting magnet 11 used can be a product on the consumer market. Therefore, in the multicharged ions generating source according to the present invention, the superconducting magnet 11 and the ion source electrode 3 need not be made precisely in an integrated structure as in the conventional multicharged ions generating source.

Mention is next made of an operation of the multicharged ions generating source of the present invention constructed as mentioned above.

Figure 4:
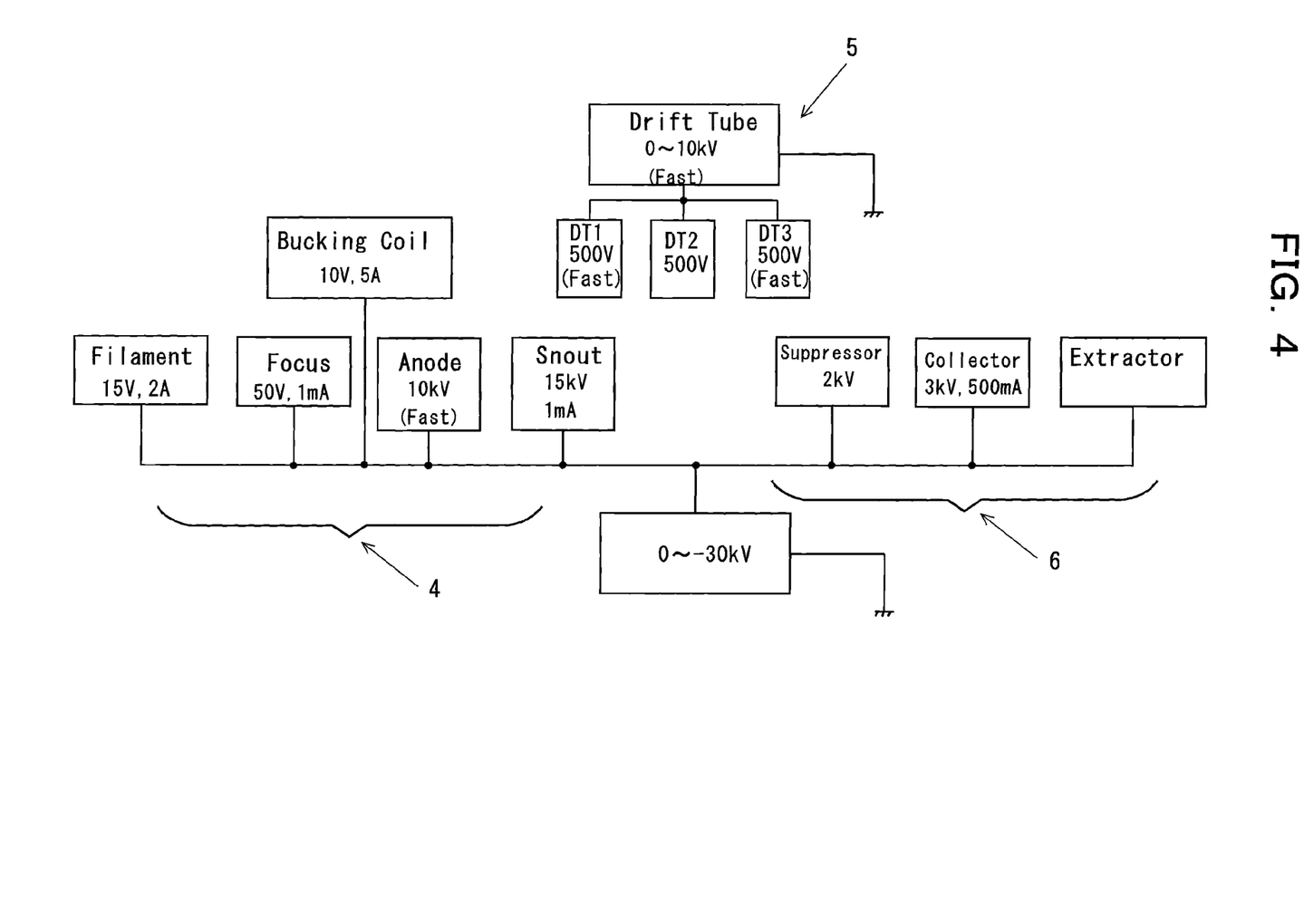
FIG. 4 is a typical block diagram for the illustration of a power supply whose output is applied to a multicharged ions generating source according to the present invention.

FIG. 4 is a typical block diagram for the illustration of a power supply whose output is applied to a multicharged ions generating source according to the present invention. There is shown an example in which the electron accelerating voltage is 40 kV. As shown, the filament, focus, anode and snout electrodes in the electron source 4 are supplied from power sources of 15 V and 2 A, 50 V and 1 mA, 10 kV, and 15 kV and 1 mA, respectively, each superimposed to a power source of −30 kV. And, as for the drift tube 5, its first, second and third electrodes are each supplied with 500 V superimposed to a power source of 10 kV. Further, the suppressor, collector and extractor electrodes of the collector 6 are supplied from power supplies of 2 kV, 3 kV and 500 mA and −3 kV, respectively, superimposed to −30 kV of a power supply.

Electrons generated from the electron source 4 are passed through the drift tube 5 disposed in a magnetic field produced by the superconducting magnet 11. When the power supply shown in FIG. 4 is used, electrons are accelerated to 40 kV at the maximum between the electron source 4 and the drift tube 5. The electrons accelerated and incident in the drift tube 5 is compressed by the strong magnetic field built up in the drift tube 5 by the superconducting magnet 11, forming an electron beam having a high current density (~1000 A/cm$^2$) which is collected into the collector 6. If the power supply shown in FIG. 4 is used, the electron beam is decelerated to around 2 to 3 kV and then collected into the collector 6. The electrons are designed to have a maximum accelerating voltage applied thereto immediately ahead of the drift tube 5. Since to ionize an atom, the atom must be bombarded with an electron having an energy more than the ionization energy of a bound electron, completely ionizing a heavy element, e. g., xenon (Xe), entails an energy higher than the ionization energy of the 1s orbital (i. e., 35 keV for Xe), thus necessitating an accelerating voltage more than 35 kV.

On the other hand, the gas introduced from the gas infeed means 20 to be ionized, is ionized in the drift tube 5. Where the drift tube 5 has several divided electrodes, those constituting its both ends are given a potential such as to form a barrier (square well potential) to ions. Ions are trapped in the square well potential for a given time period in which ionization of gas atoms repetitively bombarded with an electron beam is advanced. Their impact ionization by electrons proceeds until they become multicharged ions. Multicharged ions that are elevated in kinetic energy so as to cross the barrier by being bombarded with electrons are taken out of the ion source.

When the degree of ionization for ions thus reaches the ultimate or a state that continuing electrons to impinge no longer causes ionization to proceed, the configuration of electric field is altered so as to cause multicharged ions to issue out, thereby producing a beam of multicharged ions 24.

When multicharged ions produced with the drift tube 5 are drawn out of the drift tube 5, they are once accelerated to 40 kV between the drift tube 5 and the collector 6, and when issuing from the first vacuum chamber 2 which is at the earth potential they are decelerated down to 10 kV to exit.

The intensity of a multicharged ions beam 24 obtained is proportional to the length L1 (see FIG. 1) of the ion trapping drift tube 5 and the emission current whereas the time period until the degree of ionization reaches the ultimate is proportional to the current density of electrons. By the way, if the length of the drift tube 5 is too long, the plasma becomes unstable, and the multicharged ions of high degree of ionization cannot be formed.

Also, the current density of an electron beam becomes higher (but not proportionally) as the strength of a magnetic field applied by the superconducting magnet 11 to the drift tube 5 is higher. For this reason, the intensity of a multicharged ions beam 24 obtained per unit time can be made higher as the electron beam current density is higher and the trapping region is longer in length.

The mechanisms of multicharged ions generation mentioned above are the same as those of the conventional multicharged ions generating source.

A feature of the present invention is that a vacuum pumping unit 15 for the first vacuum chamber 2 containing the ion source electrode 3 and a vacuum pumping unit 16 for the second vacuum chamber 10 receiving the superconducting magnet 11 can be removed and separated from each other. Thus, in the state that the second vacuum chamber 10 containing the superconducting magnet 11 is separated from the first vacuum chamber 2, it is possible to sufficiently heat and degas the first vacuum chamber 2 and the ion source electrode 3 housed in the first vacuum chamber 2.

Therefore, it is possible to evacuate the first vacuum chamber 2 for producing multicharged ions in a short period of time to an extremely high vacuum. For example, if an electron beam by error impinges on the drift tube 5, then only the first vacuum chamber 2 accommodating the ion source electrode may be mended in the multicharged ions generating source 1. Since this allows the vacuum to be quickly built up in a region of the ion source electrode 3 of the multicharged ions generating source 1, it is possible to realize a multicharged ions generating source 1 which is excellent in operability and maintainability.

Figure 5:
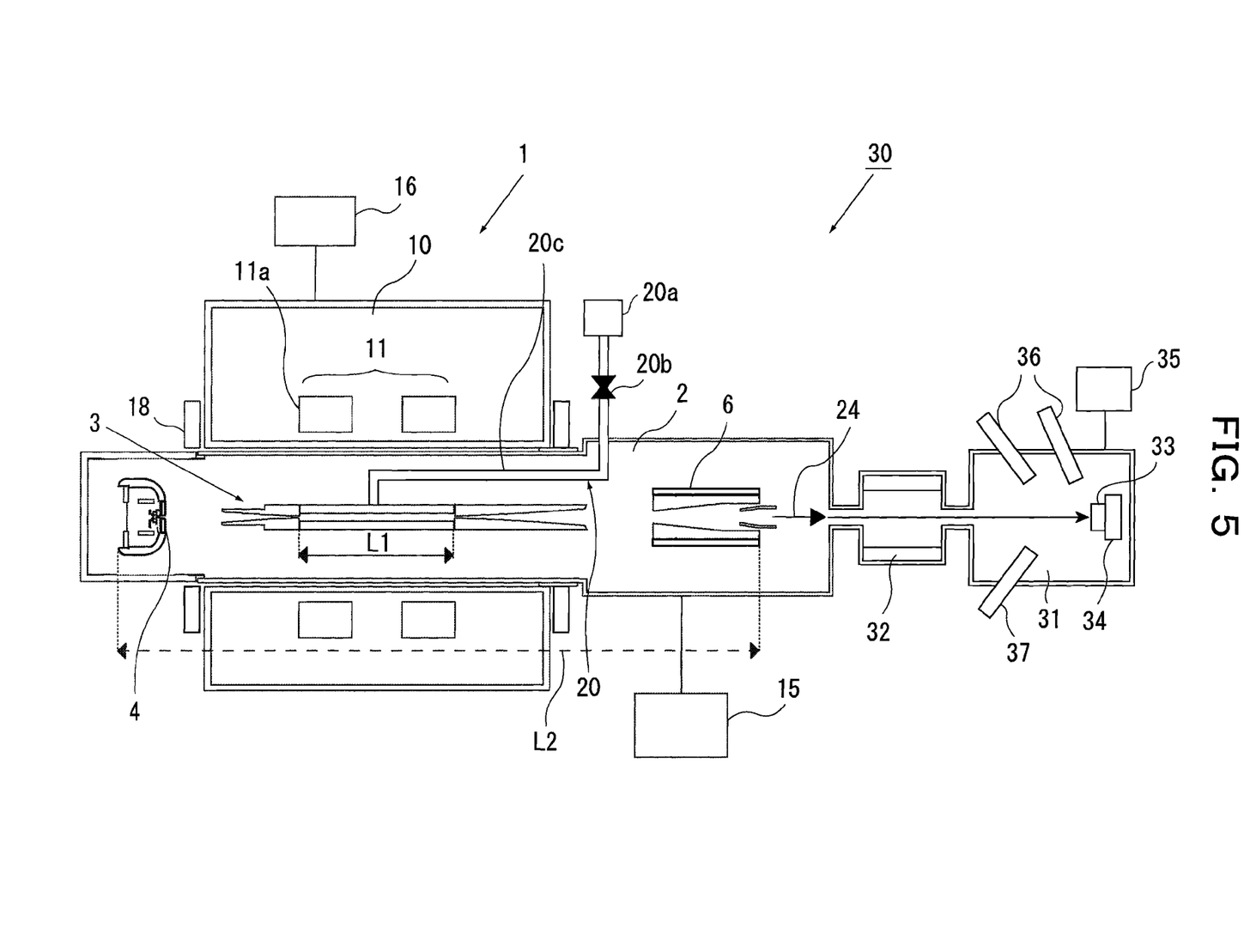
FIG. 5 is a diagrammatic view illustrating the structure of a charged particle beam apparatus using a multicharged ions generating source in accordance with the present invention.

Mention is next made of a charged particle beam apparatus using a multicharged ions generating source in accordance with the present invention. FIG. 5 is a diagrammatic view illustrating the structure of a charged particle beam apparatus 30 using the multicharged ions generating source 1 in accordance with the present invention. The charged particle beam apparatus 30 using the multicharged in generating source 1 has a third vacuum chamber 31 connected to the multicharged ions generating source 1. An ion separator 32 and a specimen support 34 supporting a specimen 33 are contained in the third vacuum chamber 31. The third vacuum chamber 31 is evacuated to a vacuum by a vacuum pumping unit 35 independently of the vacuum pumping units 15 and 16 in the multicharged ions generating source 1.

The ion separator 32 is provided to select desired multicharged ions from multicharged ions generated by the multicharged ions generating source 1. For the ion separator 32, an analyzing magnet (deflector magnet), a Wien filter using an electric and a magnetic field, or the like may be used. For the specimen support 34 supporting the specimen, an XYZ stage or the like in which position can be controlled may be used.

The charged particle beam apparatus 30 may be equipped with an inspection means 36 for a surface of the specimen. As an inspection means, an apparatus such as an electron diffractograph, a scanning electron microscope (SEM), a scanning tunneling microscope (STM), a secondary ion mass spectrograph (SIMS) or the like may be used. It may also be equipped with a surface treated means 37. An apparatus such as a surface cleaning, vapor deposition or the like may be used as the surface treated means.

Mention is next made of an operation of the charged particle beam apparatus 30 using the multicharged ions generating source 1 in accordance with the present invention.

Various multicharged ions generated by the multicharged ions generating source 1 are selected by the ion separator 32 for desired multicharged ions and are irradiated onto the specimen. Then, a surface of the specimen prior to irradiation with the multicharged ions can be cleaned by the surface treated means 37. Further, the specimen when irradiated with the multicharged ions can be in situ inspected or checked by the inspection means 36 as regards its shape and crystallographic state. The charged particle beam apparatus 30 using a multicharged ions generating source 1 in accordance with the present invention can be applied to nano processes since the multicharged ions generating source is light in weight.

EXAMPLE

As a specific example, the multicharged ions generating source 1 was constructed (see FIGS. 1 and 2) that as a superconducting coil a superconducting magnet 11 on the market was disposed in the second vacuum chamber 10 separate from an electron and an ion beam, and it was used an accelerating voltage of 10 to 40 kV, an electron beam current of 300 mA and an ion trapping magnetic field of 3T. A superconducting coil of Helmholtz type was adopted and the drift tube 5 having a length of 200 mm was used to expand the ion trapping region, thereby achieving a higher intensity of the multicharged ions beam 24.

Mention is next made of a magnetic field by a superconducting magnet and an electron beam trajectory in the multicharged ions generating source 1 of the specific example.

Figure 6:
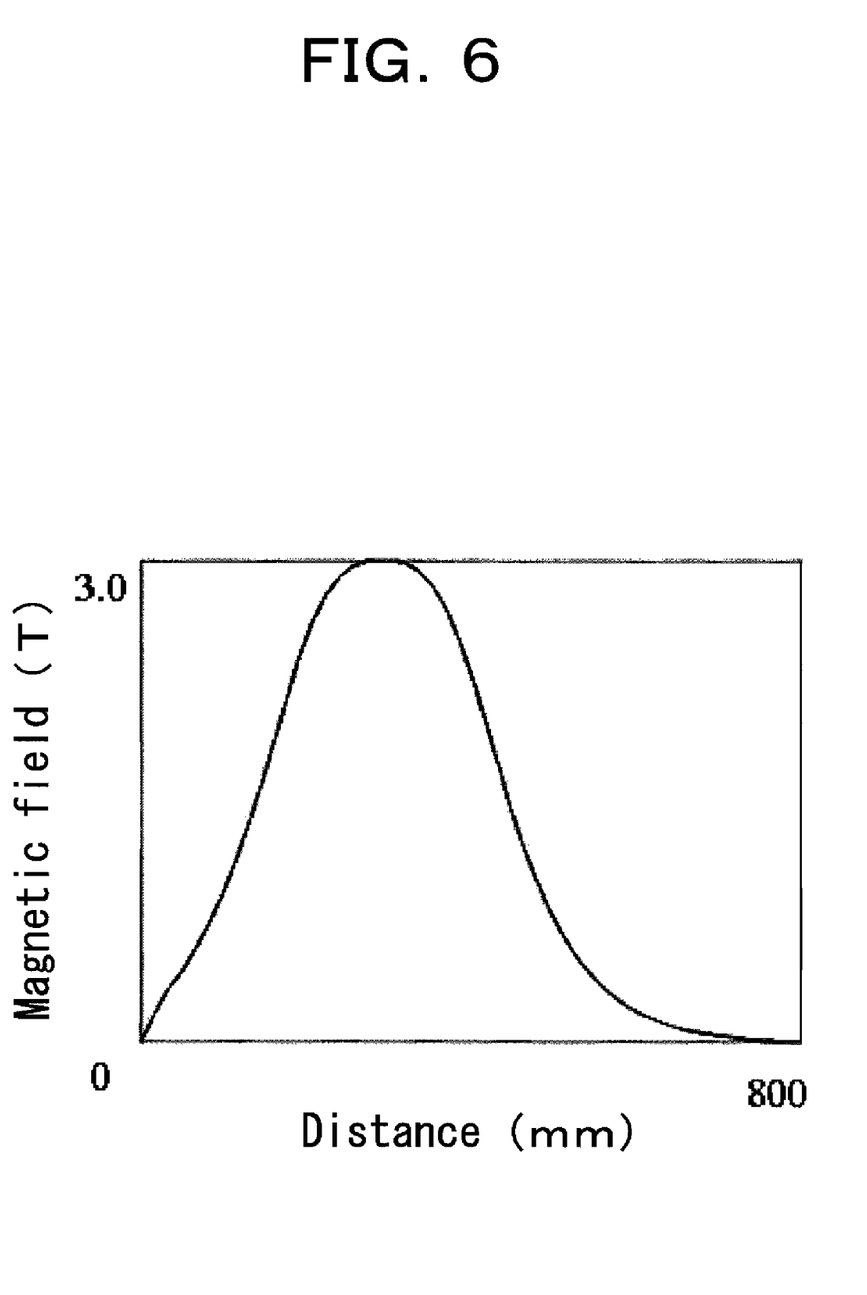
FIG. 6 is a graph illustrating a magnetic field applied by a superconducting magnet having a Helmholtz coil for use in a multicharged ions generating source in a specific example.

FIG. 6 is a graph illustrating a magnetic field applied by the superconducting magnet 11 having the Helmholtz coil for use in the multicharged ions generating source 1 in the specific example. In the graph, the abscissa axis represents a distance (in mm) from the cathode to the collector 6 in the direction of horizontal axis and the ordinate axis represents a magnetic field in Tesla (T) produced in the first vacuum chamber 2. As is apparent from the graph, it is seen that the magnetic field is 3 T at its maximum and is even in a distance of 100 mm for a range of 5% of the maximum field. As a consequence, when the drift tube 5 has a length of 100 mm to 200 mm, a uniform magnetic field could be formed in its central area.

Figure 7:
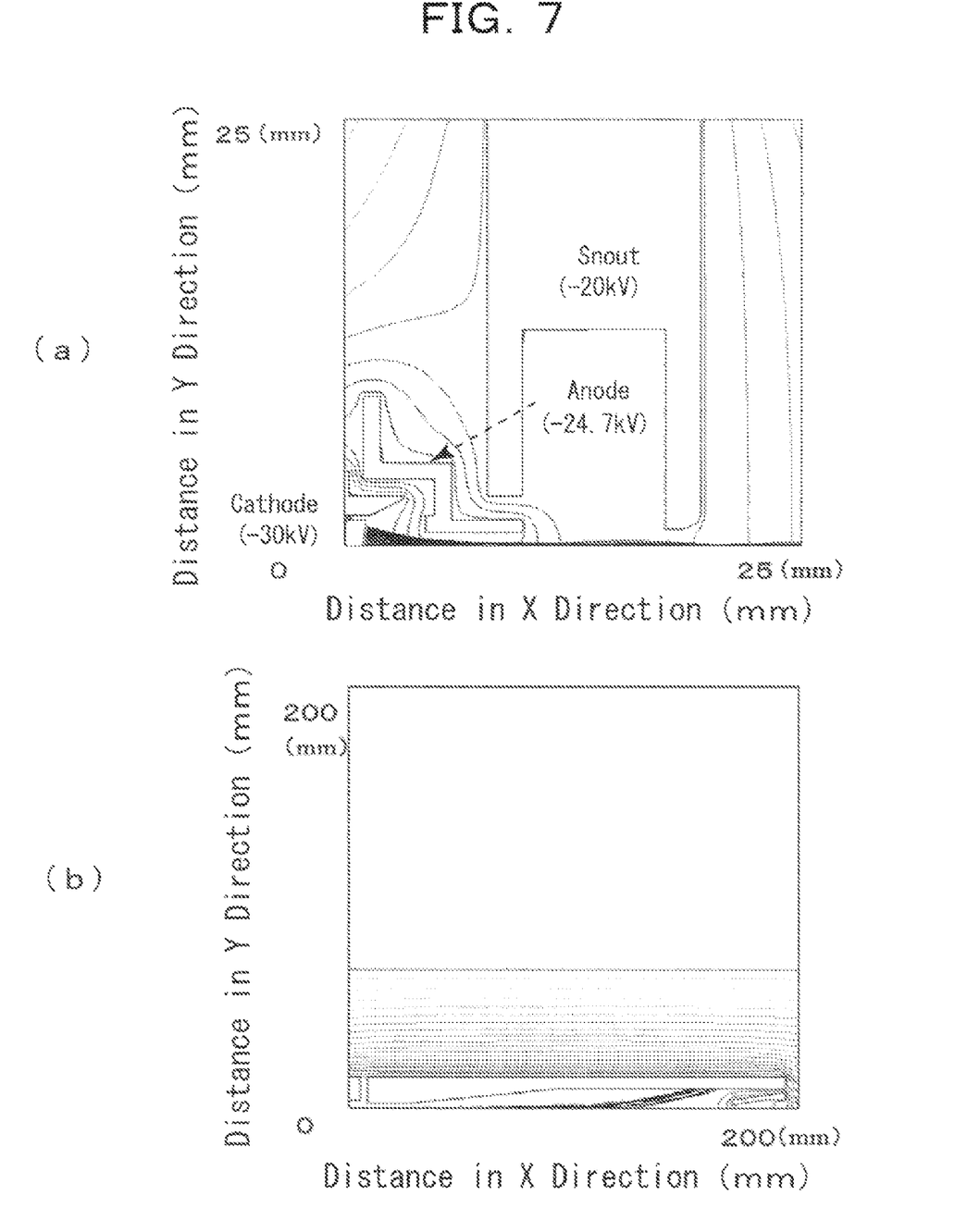
FIG. 7 shows diagrams illustrating results of computation for trajectories of an electron beam accelerated at 40 keV in the multicharged ions generating source in the example in which diagram (a) represents those in a region of the cathode and diagram (b) represents those in a region of the collector.

FIG. 7 shows diagrams illustrating results of computation for trajectories of an electron beam accelerated at 40 keV in the multicharged ions generating source 1 in the example in which diagram (a) represents those in a region of the cathode and diagram (b) represents those in a region of the collector. In the diagrams (a) and (b), the abscissa axes represent distances (in mm) in the direction of horizontal axis (X) and the ordinate axes represent distances (in mm) in the direction vertical (Y) to the horizontal axis, from the left hand side ends of the cathode and the collector, respectively. The TiComp 2D software (made by Field Precision Inc.) was used for computing the electron beam trajectories.

From FIG. 7(a), it is seen that electrons emitting from the cathode are passed through the anode to become an electron beam having a diameter less than 0.1 mm. From FIG. 7(b), it is seen that the electrons incident on the collector 6 gradually spread out and are collected by the collector electrode.

TABLE 1

| Item | Example | Prior Art 3 |
| --- | --- | --- |
| Maximum Accelerating Voltage (kV) | 40 | 300 |
| Maximum Electron Beam Current (mA) | 300 | 300 |
| Magnetic Field Strength (T) | 3 | 4.5 |
| Type of Cooling of Superconducting Magnet | Closed-Cycle Refrigerator | Liquid He Tank |
| Size: Height (m) × Width (m) | 0.6 × 1 | 3 × 2 |
| Direction of Beam Axis | Horizontal | Vertical |

Table 1 compares the multicharged ions generating source 1 of the Example and the EBIT of Prior Art 3. The multicharged ions generating source 1 of the Example used a maximum accelerating voltage of 40 kV necessary to ionize xenon and a maximum electron beam current of 300 mA and had the superconducting magnet 11, in which magnetic field intensity was 3T, cooled by a closed-cycle refrigerator. It is capable of beaming of high charged ions to emerge in a horizontal direction.

On the other hand, the EBIT (Reference 6) of Prior Art 3 used a maximum accelerating voltage of 300 kV required to ionize uranium, a maximum electron beam current of 300 mA and had the superconducting magnet cooled in a liquid He tank, producing a magnetic field intensity to 4.5 T. It was capable of beaming of multicharged ions to emerge in a vertical direction.

The multicharged ions generating source 1 in the present invention and the EBIT in Prior Art 3 differ from each other in their sizes (height×width L2), viz., 0.6 m×1 m in the present invention and 3 m×2 m in Prior Art 3. Thus, the size of the multicharged ions generating source 1 of the present invention can be made compact compared to that of the EBIT in Prior Art 3. From the above, it is seen that in contrast to the large apparatus of 3 m×2 m in size (vertical) of the multicharged ions generating source in Prior Art 3, the apparatus of 0.6×1 m in size (horizontal) in the Example is compact that is brought to realization as the multicharged ions generating source 1 which is equal or superior in performance thereto when applied to nano processes.

The source was made easier to manufacture by having the superconducting magnet 11 accommodated in the second vacuum chamber 10 separately from the first vacuum chamber 2 receiving the electron and the ion beam. As a consequence, it became possible to easily and selectively bake the ion source electrode 3 to be held at an extremely high vacuum and to largely reduce the cost for the apparatus as well as the maintenance cost needed to keep its performance.

The multicharged ions generating source of the present invention and the charged particle beam apparatus using the same can be applied to perform a nano process using multicharged ions.

It should be understand that the present invention is not limited to the specific forms of implementations mentioned above but various modifications thereof may be made within the scope of the invention defined in the appended claims. For example, the structure of the ion source electrode comprising the electron source, the drift tube constituting the ion trapping region and the collector, and the strength of a magnetic field of the superconducting magnet can be altered suitably in accordance with an accelerating voltage and an electron beam current.

INDUSTRIAL APPLICABILITY

In accordance with the present invention, it is possible to realize the multicharged ions generating source in which the first vacuum chamber for producing multicharged ions can be evacuated in a short period of time to an extremely high vacuum and the vacuum in a region of the ion source electrode can be established only in a short time period and which thus is excellent in controllability and maintainability. The apparatus for this ion source is also light in weight and can be manufactured at a reduced cost.

Further, in accordance with the present invention, it is possible to provide the charged particle beam apparatus which due to the use of the multicharged ions generating source as mentioned above, is light in weight and which owing to the fact that the vacuum can be established only in a short period of time is excellent in operability and maintainability. Hence, this apparatus can be suitably used in a nano process.

What is claimed is:

1. A source of generating multicharged ions, including:
an ion source electrode comprising an electron source, a drift tube that constitutes an ion trapping region and a collector;
a superconducting magnet for ion entrapment; and
an ion infeed means, characterized in that it further includes:
a first vacuum chamber receiving said ion source electrode;
a second vacuum chamber receiving said superconducting magnet;
wherein said first vacuum chamber is disposed by being passed through said second vacuum chamber,
a vacuum pumping means are provided to said first and said second vacuum chambers, respectively,
a first magnetic shield is provided in a peripheral area of the second vacuum chamber on the first vacuum chamber side so that the magnetic field by said superconducting magnet does not leak to the electron source of said ion source electrode and said drift tube of the collector side,
at least the opposing surfaces of said first and second vacuum chambers are formed with a nonmagnetic material so that the magnetic field by said superconducting magnet is applied to said drift tube, and
the electron source of the ion source electrode in said first vacuum chamber is received in a second magnetic shield part.

2. The source of generating multicharged ions as set forth in claim 1, characterized in that said second vacuum chamber is cross-sectionally in the form of a ring through which said first vacuum chamber is passed.

3. The source of generating multicharged ions as set forth in claim 2, characterized in that said superconducting magnet is in the form of a ring received in said second vacuum chamber 4. The source of generating multicharged ions as set forth in claim 1, or claim 2, characterized in that said second vacuum chamber is made removable from said first vacuum chamber without breaking vacuum of both the chambers.

5. The source of generating multicharged ions as set forth in any one of claims 1 to 3, characterized in that said superconducting magnet is a superconducting magnet that uses a Helmholtz coil.

6. The source of generating multicharged ions as set forth in claim 1, characterized in that said electron source has an accelerating voltage of 10 to 40 kV.

7. A charged particle beam apparatus characterized in that it is provided with an ion source electrode comprising an electron source, a drift tube that constitutes an ion trapping region and a collector; a superconducting magnet for ion entrapment; and an ion infeed means, and further includes a first vacuum chamber receiving said ion source electrode; a second vacuum chamber receiving said superconducting magnet; and a vacuum pumping means provided for each of said first and second vacuum chambers, wherein said first vacuum chamber is disposed by being passed through said second vacuum chamber, a vacuum pumping means are provided to said first and said second vacuum chambers, respectively, a first magnetic shield is provided in a peripheral area of the second vacuum chamber on the first vacuum chamber side so that the magnetic field by said superconducting magnet does not leak to the electron source of said ion source electrode and said drift tube of the collector side, at least the opposing surfaces of said first and second vacuum chambers are formed with a nonmagnetic material so that the magnetic field by said superconducting magnet is applied to said drift tube, and a multicharged ion generating source receiving the electron source of the ion source electrode in said first vacuum chamber into a second magnetic shield part, and a mechanism to introduce a multicharged ion generated from said multicharged ion generating source on to a specimen surface, are provided.

8. A charged particle beam apparatus characterized in that it is provided with an ion source electrode comprising an electron source, a drift tube that constitutes an ion trapping region and a collector; a superconducting magnet for ion entrapment; and an ion infeed means, and further includes a first vacuum chamber receiving said ion source electrode; a second vacuum chamber receiving said superconducting magnet; and a vacuum pumping means provided for each of said first and second vacuum chambers, wherein said first vacuum chamber is disposed by being passed through said second vacuum chamber, a vacuum pumping means are provided to said first and said second vacuum chambers, respectively, a first magnetic shield is provided in a peripheral area of the second vacuum chamber on the first vacuum chamber side so that the magnetic field by said superconducting magnet does not leak to the electron source of said ion source electrode and said drift tube of the collector side, at least the opposing surfaces of said first and second vacuum chambers are formed with a nonmagnetic material so that the magnetic field by said superconducting magnet is applied to said drift tube, and a multicharged ion generating source receiving the electron source of the ion source electrode in said first vacuum chamber into a second magnetic shield part, and further a third vacuum chamber connected to said multicharged ion generating source and its vacuum pumping means, and, by disposing an ion separator and a specimen stage in said third vacuum chamber and setting a specimen on said specimen stage, it attains the function to select the desired multicharged ion by the ion separator from the multicharged ions generated from the multicharged ion generating source, and to irradiate the specimen surface.

9. The charged particle beam apparatus as set forth in claim 7, or claim 8, characterized in that it further includes a means for inspecting said specimen.

* * * * *